United States Patent
Singh

(10) Patent No.: US 7,205,629 B2
(45) Date of Patent: Apr. 17, 2007

(54) LATERAL SUPER JUNCTION FIELD EFFECT TRANSISTOR

(75) Inventor: Ranbir Singh, Gathersburg, MD (US)

(73) Assignee: WidebandGap LLC, South Riding, VA (US)

(*) Notice: Subject to any disclaimer, the term of this patent is extended or adjusted under 35 U.S.C. 154(b) by 0 days.

(21) Appl. No.: 10/859,564

(22) Filed: Jun. 3, 2004

(65) Prior Publication Data

US 2005/0269660 A1    Dec. 8, 2005

(51) Int. Cl.
H01L 23/58 (2006.01)
(52) U.S. Cl. ............ 257/492; 257/493; 257/343; 257/141; 257/122
(58) Field of Classification Search ......... 257/492, 257/493, 343, 141, 122
See application file for complete search history.

(56) References Cited

U.S. PATENT DOCUMENTS

| | | | |
|---|---|---|---|
| 5,264,713 A | | 11/1993 | Palmour |
| 5,329,142 A | * | 7/1994 | Kitagawa et al. ........... 257/139 |
| 5,459,089 A | * | 10/1995 | Baliga .................. 438/167 |
| 6,100,549 A | * | 8/2000 | Weitzel et al. ............ 257/194 |
| 6,281,521 B1 | | 8/2001 | Singh |
| 6,573,128 B1 | | 6/2003 | Singh |
| 6,600,375 B1 | | 7/2003 | Morse et al. |
| 2001/0024138 A1 | | 9/2001 | Dohnke et al. |
| 2002/0190258 A1 | | 12/2002 | Harada et al. |
| 2003/0168704 A1 | | 9/2003 | Harada et al. |
| 2003/0168919 A1 | | 9/2003 | Friedrichs et al. |

OTHER PUBLICATIONS

C Hatfield et al., "DC 1-V Characteristics and RF Performance of a 4H-SiC JFET at 773K," IEEE Transactions on Electron Devices, vol. 45, No. 9, Sep. 1998.
D. Alok et al., "4H-SiC RF Power MOSFETS," IEEE Electron Device Letters, vol. 22, No. 12, Dec. 2001.
R. Singh et al., "High Temperature SiC Trench Gate p-IGBTs," IEEE Transactions on Electron Devices, vol. 50, No. 3, Mar. 2003.
S. Banerjee et al., "1300-V 6H-SiC Lateral MOSFETs with two RESURF Zone," IEEE Electron Device Letters, vol. 23, No. 10, Oct. 2002.
R. Singh et al., "SiC Power Schottky and PiN Diodes,"IEEE Transactions on Electron Devices, vol. 49, No. 4, Apr. 2002.
R. Singh et al., "Development of High-Current 4H-SiC ACCUFET," IEEE Transactions on Electron Devices, vol. 50, No. 2, Feb. 2003.

(Continued)

*Primary Examiner*—Evan Pert
*Assistant Examiner*—Tan Tran
(74) *Attorney, Agent, or Firm*—Andrew Bodendorf

(57) ABSTRACT

A voltage booster transistor with an optimal conducting path formed in widebandgap semiconductors like Silicon Carbide and Diamond, is provided as a power transistor with a voltage rating >200V. Contrary to conventional vertical design of power transistors, a higher, optimum doping for a given thickness supports higher Source/Drain blocking voltage. A topside and backside gate region of the opposite conductivity type than the channel region providing control of source to drain current path through a small gate voltage. The backside gate and the Drain junction are able to support the rated blocking voltage of the device.

39 Claims, 8 Drawing Sheets

OTHER PUBLICATIONS

Trew et al., "The Potential of Diamond and SiC Electronic Devices for Microwave and Millimeter-Wave Power Applications," Proceedings of the IEEE, vol. 79, No. 5, May 1991.

Clarke et al., "SiC Microwave Power Technologies," Proceedings of the IEEE, vol. 90, No. 6, May 2002.

B. Jayant Baliga, "Trends in Power Semiconductor Devices," IEEE Transactions on Electron Devices, vol. 43, No. 10, Oct. 1996.

Friedricks et al., "Stacked high voltage switch based on SiC VJEFTs," ISPSD, Cambridge, UK, Apr. 14-17, 2003.

G. Kelner et al., "High Temperature Operation of a-Silicon Carbide Buried Gate Junction Field-Effect Transistors," Electronics Letters, vol. 27, No. 12, Jun. 6, 1991.

Meneghesso et al., "Trap Characterization in Buried-Gate N-Channel 6H-SiC JFETs," IEEE Electron Device Letters, vol. 22, No. 9, Sep. 2001.

Rozario et al., "Thermal Cycling Study of SiC BGJFETs," IEEE 1998.

B. Weis et al., "Turn-off and short curcuit behaviour of 4H SiC JFETs," IEEE 2001.

* cited by examiner

LATERAL SUPER JUNCTION FIELD EFFECT TRANSISTOR

TECHNICAL FIELD

The following description relates generally to semiconductor devices, and in particular to power and microwave devices using widebandgap semiconductors.

BACKGROUND

Most conventional semiconductor power devices are almost exclusively formed using silicon (Si). Due to the relative maturity of the use of this semiconductor, the performance of conventional power devices to carry high currents and block high voltages is closely approaching the theoretical limit for Si. For example, power MOSFETs made using Si have undergone many improvements over the past two decades and allowing them to block 30 to 1,200 volts while providing relatively low on-state resistance values.

However, there are many applications for power devices that require the ability to carry high currents and block voltages, for example, in the range of 600 V to 15 kV (and greater). These applications include motor control, power supply, lighting ballast, power transmission and generation, and utility power conversion. Unfortunately, the overall performance of power devices made using Si is poor for this voltage range and represents the primary limitation in realizing circuits for these applications, In fact, if high voltage power devices that support high currents and operate at frequencies of one to 100 kHz were available, they would revolutionize power utility applications and result in power savings of as much as $20 billion in the United States.

One recent development in semiconductor power devices is the use of Intelligent Power Modules (IPMs). IPMs use low voltage CMOS circuitry that may be integrated with power devices. Other examples of intelligent power devices include discrete integrated power devices that detect unacceptable current, voltage, and temperature conditions However, the relatively low blocking voltage of semiconductor power devices made using Si limits the application of these devices in majority carrier devices (e.g., devices that rely on resistive current transport) to 1200 V or less.

For higher power devices (e.g., those blocking voltages greater than 1200 V), bipolar devices, such as, insulated gate bipolar transistors (IGBTs) and Thyristors have been used. While these devices offer acceptable on-state performance, they suffer from relatively slow switching speeds and poor performance at high temperatures.

Other power devices that have been researched also suffer from various deficiencies. For example, Bipolar Junction Transistors (BJTs) use a current control gate rather than a preferable voltage control gate. Many vertical junction field effect transistors (JFETs) operate in a "normally-on" mode during their on-state condition; however, JFETs with the preferable "normally-off" mode have poor on-state resistances. Thyristors have high on-state voltage drops (because of their inherent junction drop) and slow switching speeds.

A variety of power devices using silicon carbide (SiC) have been researched and implemented in an attempt to provide devices that block high voltages and carry high currents. One switching power device is the vertical power MOSFET. However, vertical power MOSFETs made using SiC suffer from poor performance and poor reliability because of low inversion layer channel mobility. In addition, the tunneling current between SiC and the gate dielectric limits the reliability of these power devices made using SiC during their long term operation.

Another area in which semiconductor devices are being used is the microwave transistor. Microwave transistors are expected to work at very high frequencies, for example, at 800 MHz to 10 GHz (and greater). Most conventional microwave devices are formed using gallium arsenide (GaAs) and Si structures. For example, GaAs structures include the high electron mobility transistor (HEMT), the Heterojuncntion Bipolar transistor (HBT), and the pseudomorphic HEMT. These transistors are the most commonly used lower power (e.g., fractional to 10 W) transistors. Their applications include cell phone handsets and low power networking devices.

Higher power (e.g., especially in the L-Band (400 MHz to 1 GHz), S-Band (1–3 GHz) and X-band (7–10 GHz)) transistor applications also exist including military radars and cellular phone base-station applications. These transistors may be combined with passive components to form integrated circuits that provide higher usable power levels and match external circuit components. Such integrated circuits are called microwave and millimeter wave integrated circuits (MMICs).

One example of a high power microwave device formed using SiC is the lateral power Metal-Semiconductor FET (or MESFET). A MESFET is operated by controlling the source to drain current using a Schottky gate located between these terminals (known as a T-gate). Due to the extremely high current densities in the localized region inside the MESFET, the junction temperature at the Schottky contact may significantly exceed the ambient temperature and result in a high leakage current at the gate and premature breakdown. As a result, the source terminal of the microwave MESFET must be firmly held at ground potential to achieve stable performance.

To hold the source terminal of the microwave MESFET at ground, via holes inside the source terminal must be placed through the wafer to the backside metal contacts. As a result, the yield of chips made using ultra-fine lithography is reduced (and therefore the cost of producing such chips is increased). Because the T-gate significantly increases the cost of making these chips, the use of MESFETs for many high power density microwave applications may ultimately be limited.

As an alternative to MESFETs, microwave JFETs with p-type gate regions located between the source and drain contacts have been used in an attempt to provide better robustness. However, JFETs also suffer from poor high frequency performance in microwave applications because of the challenge in making small gate widths that minimize gate to source and gate to drain capacitances.

SUMMARY

In one general aspect, a lateral super junction field effect transistor (LSJFET) or a voltage booster transistor (VBT) is described in detail below. For example, the transistor may include one or more layers including at least one layer formed of a widebandgap semiconductor having a first conductivity type a resurf layer of the widebandgap semiconductor having a second conductivity type formed on the at least one layer of the first conductivity; a backside gate formed on the one or more layers; a source region in contact with the resurf layer; a drain region, in contact with the resurf layer and spaced apart from the source region; a current conduction path in the resurf layer one or more layers of the second conductivity type between the source region and the drain region; and a gate region in contact with the resurf layer between the source region and the drain region, having the first conductivity type. In one implementation, the first conductivity type is p type and the second conductivity type is n type. In another implementation, the first conductivity is n type and the second conductivity is p type.

The transistor may have a lateral breakdown voltage between the source region and the drain region and a vertical breakdown voltage between the drain region and the backside gate, wherein the vertical breakdown voltage is greater than or equal to the lateral breakdown voltage. The transistor may have a blocking voltage of 600 V to 25 kV.

The one more layers may include a substrate layer that may be a semiconductor having a carrier concentration of dopant atoms of 0 cm$^{31\ 3}$ to $1 \times 10^{22}$ cm$^{-3}$ and a thickness of 100 to 500 μm. The resurf layer may have a carrier concentration of dopant atoms of $1 \times 10^{15}$ cm$^{-3}$ to $1 \times 10^{19}$ cm$^{-3}$ and a thickness of 0.01 to 5 μm.

In another implementation, the at least one layer of the first conductivity type is a backgate layer and may have a carrier concentration of dopant atoms of less than $10^{17}$ cm$^{-3}$ and a thickness of 0.1 to 200 μm.

The region below the gate region in the resurf layer may be doped with a substantially uniformly decreasing doping profile.

The widebandgap semiconductor used may have a bandgap EG greater than 2 eV and less than 8 eV. For example, the widebandgap semiconductor may be one of silicon carbide (with a face of the silicon carbide is one of 0001, 000-1, and 11–20 and a bandgap EG greater than 2.1 eV and less than 4 eV), diamond (with a bandgap EG of approximately 5 eV), aluminum nitride with a bandgap EG of approximately 6.1 eV), and gallium nitride (with a bandgap EG greater than 3 eV and less than 5 eV).

The transistor may have a blocking gain of greater than or equal to 20 which may be as BV/V$_{pinch}$, where BV is the voltage blocked at the drain and the V$_{pinch}$ is the pinch-off voltage causing pinch-off of the conduction path.

In another general aspect, the resurf layer may have a substantially stepwise increasing dose profile of the second conductivity type from the gate region towards the drain region. The transistor may include an expitaxially grown extension of resurf layer (or ion implanted) of the second conductivity type between the drain region and the gate region, where the extension provides a substantially increasing dose profile of the second conductivity type from the gate region to the drain region.

The transistor may have a specific on resistance of less than 300 mΩ-cm$^2$.

In another general aspect, a transistor may include one or more layers includes at least one layer of a widebandgap semiconductor having a first conductivity type; a resurf layer of the widebandgap semiconductor having a second conductivity type formed on the at least one layer of the first conductivity type the resurf layer having a doping profile substantially uniformly decreasing with depth; a backside gate formed on the one or more layers; a source region in contact with the resurf layer; a drain region in contact with the resurf layer spaced apart from the source region; a lateral current conduction path in the resurf layer between the source region and the drain region; and a gate region in contact with the resurf layer between the source region and the drain region.

The doping profile of the resurf layer is inversely proportional to the depth of the resurf layer. In another implementation, the doping profile of the resurf layer is inversely proportional to the square of the depth of the resurf layer.

The doping $N_{resurf}$ of the resurf layer by thickness of the resurf layer may be expressed as a range of plus or minus 50% as governed by the following equation:

$$\frac{1}{L_{Drift}} \int_0^{t_{resurf}} \int_0^{L_{Drift}} N_{resurf}(x, y) \partial x \partial y = \frac{\varepsilon \times E_{cr}}{q}$$

where $E_{cr}$ is the critical breakdown electric field of the semiconductor, $\varepsilon$ is the dielectric constant of the semiconductor, 'q' is the electronic charge, and $L_{Drift}$ is the distance between the drain region and the gate region.

The gate region may be located at a distance $L_{Drift}$ from the drain region where $L_{Drift}$ is expressed as:

$$L_{Drift} = \frac{(\text{Between 2 and 1}) \times BV_{Lat}}{E_{cr}}$$

where $BV_{lat}$ is the lateral breakdown voltage between source and drain and $E_{cr}$ is the critical electric field of the semiconductor.

Other features will be apparent from the description, the drawings, and the claims.

DESCRIPTION OF DRAWINGS

Like reference symbols in the various drawings indicate like elements.

DETAILED DESCRIPTION

The following description of the various implementations and embodiments illustrates general concepts of the invention which may suggest various alternatives to those skilled in the art. For example, the description makes reference to certain layers and regions being formed of a first conductivity type (e.g., n-type) and a second conductivity type (e.g., p-type) in addition to various dopings (e.g., + and −) of these areas. However, complementary devices also may be produced according to the descriptions below, such as, for example, the first conductivity type may be a p-type semiconductor and the second conductivity type may be an n-type semiconductor.

The various layers and regions may be fabricated using a number of conventional semiconductor fabrication techniques including solid source crystal growth, molecular beam epitaxy, gas source metal-organic chemical vapor deposition, wafer bonding, lithography, thermal oxidation, metallization, etching, and/or combinations thereof.

It also will be appreciated that the figures show general concepts and that sizes and dimensions of layers or regions may be exaggerated for illustrative purposes to show general structures, and are not necessarily to scale. In addition, references to a layer being formed on another layer or substrate may contemplate that additional layers intervene. Likewise, a referenced "layer" may include implementations formed of multiple layers or doping regions.

Voltage Booster Transistor Cell Structure

The device structures described below are for fabrication in all semiconductors with bandgap (EG) greater than or equal to approximately 2 eV and less than or equal to approximately 8 eV. For example, this includes silicon carbide (with EG range of 2.1 eV to 4 eV), diamond (EG 5 eV), aluminum nitride (EG 6.1 eV), and gallium nitride (with EG range 3 eV to 5 eV). In addition, all faces of the crystal structure of these semiconductors may be used. For example, faces for SiC include 0001 plane (i.e., the silicon face), 000–1 (i.e., the carbon face), or other intermediary faces like 11–20.

Figure 1:
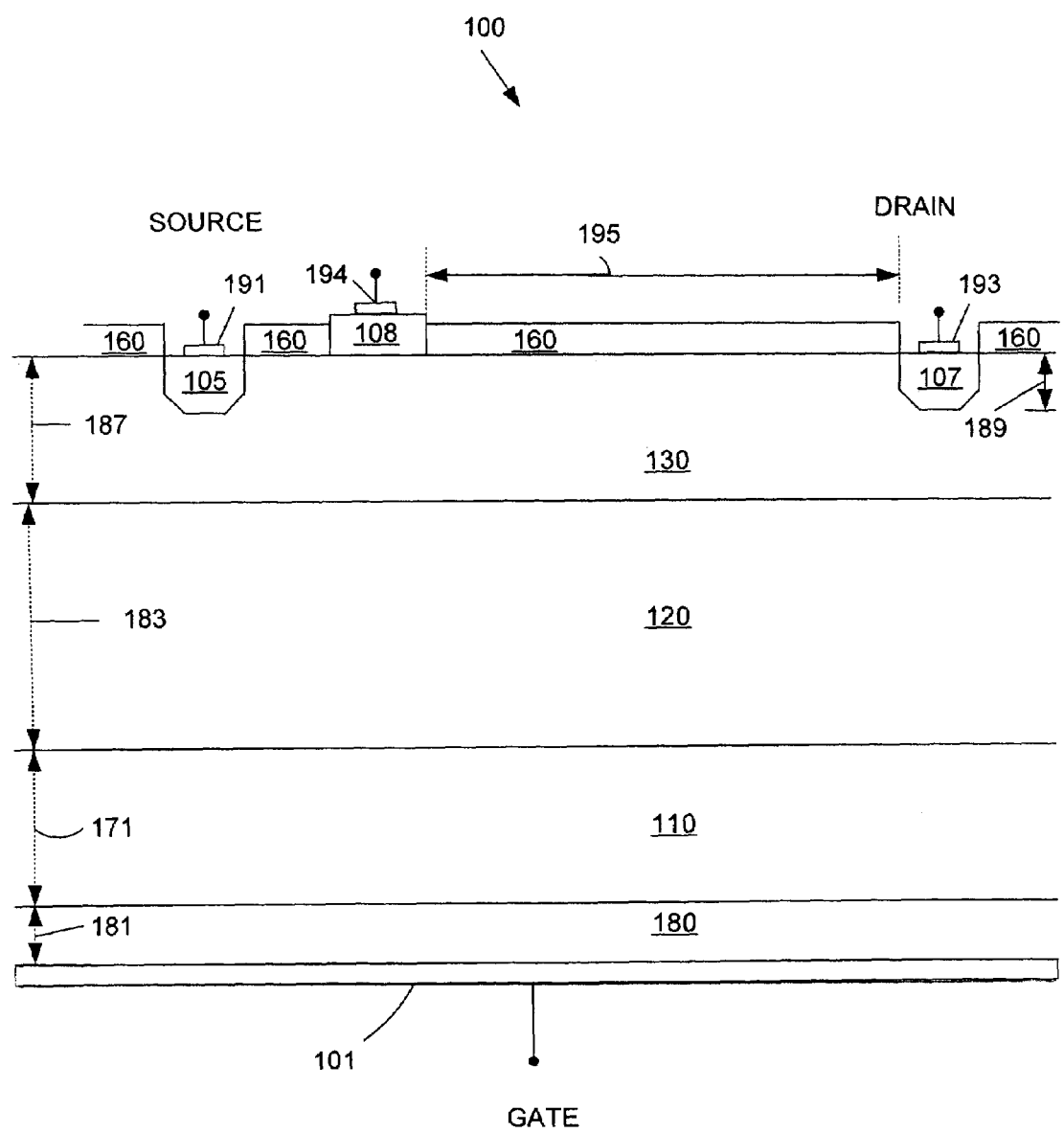
FIG. 1 shows an exemplary cell of a voltage booster transistor having a topside as well as backside gate connected electrically and an optimally doped conduction path between the source and the drain.

FIG. 1 shows the structure of a lateral super junction field effect transistor (LSJFET) or a voltage booster transistor (VBT). As shown by the exemplary implementation illustrated in FIG. 1, a cell 100 of the VBT includes a backside gate terminal 101 with an optimally doped conduction path between a source region 105 and a drain region 107. The VBT also may include a topside gate region 108 located between the source region 105 and the drain region 107.

The cell 100 may include three or more layers including a first layer 110, a second layer 120, and a third layer 130. The area surrounding the source region 105, drain region 107, and the gate region 108 may be formed using a passivating dielectric 160.

The first layer 110 may be formed using a p-type or n-type substrate having a backside metallized gate terminal 101. In one implementation, the layer 110 may have a thickness ($t_{substrate}$) 171 of approximately 100–500 μm with a doping of zero to $10^{22}$ cm$^{-3}$. In another example, the substrate may be formed of a semi-insulating or insulating substrate material.

An optional very thin highly doped backside layer 180 of the same conductivity type as layer 110 may be ion implanted in the substrate 110 or epitaxially grown thereon having a thickness 181 of 0.01 to 10 μm. The highly doped backside layer 180 may be provided to prevent a vertical electric field from reaching the metallized gate terminal 101.

The second layer 120 may be formed of a low doped p-type conductivity semiconductor between layer 110 and layer 130. The layer 120 may be grown (e.g., using a high quality epitaxial process) on layer 110 to a thickness ($t_{backside\ gate}$) 183 of one to 200 μm with an acceptor doping $N_A$. If layer 110 has a doping less than or equal to $10^{17}$ cm$^{-3}$, layer 120 is optional. However, when the doping of layer 110 exceeds $10^{17}$ cm$^{-3}$, layer 120 should be included with a doping NA, for example, of $10^{12}$ cm$^{-3}$ to $10^{18}$ cm$^{-3}$. A more precise description of how to determine $N_A$ is given below.

The layer 130 may be epitaxially grown or implanted with an optimal doping $N_{resurf}$ (x,y), which can vary along the drift layer length 195 (x-direction) and along the thickness of the resurf layer (y-direction). Tolerance on the doping $N_{resurf}$ and thickness ($t_{resurf}$) 187 of layer 130 is roughly plus or minus 50% from the optimal doping calculated using the design equations given below. Layer 130 may be doped from $10^{15}$ cm$^{-3}$ to $10^{19}$ cm$^{-3}$ having a thickness of 0.01 to 1.0 μm.

In one implementation, the source region 105 and drain region 107 may be formed of highly doped N+ areas to form low resistance ohmic contacts. The source region 105 and the drain region 107 may be ion implanted (in layer 130) or epitaxially grown (on layer 130) with doping, for example, greater than $10^{17}$ cm$^{-3}$ with a thickness 189 of 0.01 to 1 μm. The source region 105 and the drain region 107 are used to provide ohmic contacts for the source terminal 191 and drain terminal 193.

The topside gate region 108 may be formed of a highly doped p+area to form a low resistance ohmic gate contact for a topside gate terminal 194. The topside gate region 108 may be ion implanted or expitaxially grown with doping, for example, greater than $10^{17}$ cm$^{-3}$ with a thickness of 0.01 to 1 μm. The topside gate region 108 may be placed in relative close proximity to the n+ source region 105. For example, the topside gate region 108 may be located beginning at a distance from the source region 105 of 0.1 μm to 100 μm and at a distance ($L_{drift}$) 195 of 0.1 to 200 μm from the drain region 107, according to the design conditions described in further detail below.

The area surrounding the source region 105, drain region 107, and the topside gate region 108 may be formed using an appropriate passivating dielectric 160, such as, for example, silicon dioxide, silicon nitride, polyimide, deposited SiC, deposited diamond, or other high-k dielectrics.

VBT Design

The layer 130 ensures that the electric field at the surface of layer 130 is sufficiently low (e.g., in one implementation 0 V/cm) when the VBT is blocking its highest voltage (BV). In one implementation, an electric field of 0 V/cm may be maintained at the surface if the electric field at the voltage blocking junction (e.g., the junction between layer 120 and layer 130 and layer 110 and layer 130 (if layer 120 is not present)) is close to the critical breakdown electric field $E_{cr}$ of the semiconductor. Approximate values for $E_{cr}$ for various semiconductors are:

$E_{cr,\ Si}$: 0.25 MV/cm
$E_{cr,SiC}$: 2 MV/cm
$E_{cr,c}$: 5 MV/cm

The optimal doping of layer 130 by thickness of layer 130 may be expressed as:

$$\frac{1}{L_{Drift}}\int_0^{tresurf}\int_0^{L_{Drift}} N_{resurf}(x,y)\partial x \partial y = \frac{\varepsilon \times E_{cr}}{q}$$

where $\varepsilon$ is the dielectric constant of the semiconductor (e.g., 11.9×$\epsilon_r$ for Si, 9.7×$\epsilon_r$ for SiC, and 5×$\epsilon_r$ for diamond) where $\epsilon r$ is the permittivity for air (e.g., 8.854×$10^{-14}$ F/cm) and 'q' is the electronic charge (1.602×$10^{-19}$ C). In this case, BV (i.e., the highest voltage blocked at the drain) may be expressed as the lesser of the two:

$BV_{Lat}$=(Between 1 and 0.5)×($L_{Drift}$×$E_{cr}$) (the approximate lateral breakdown condition); and $$BV_{Vert} = \frac{1}{2} \times t_{backgate}\left(E_{cr} + \frac{qN_A}{\varepsilon}t_{backgate} + \frac{1}{2} \times \frac{qN_A^2}{\varepsilon N_{Subs}}t_{backgate}\right)$$

(the approximate vertical breakdown condition) where $N_{subs}$ is the substrate doping. As can be seen, these two equations express two competing breakdowns: a vertical breakdown and a lateral breakdown. To design a VBT with the lowest on-resistance for a given blocking voltage, the vertical blocking voltage should be greater than or equal to the lateral blocking voltage. Approximate formulae for the lateral and the vertical breakdowns are given above. If the vertical breakdown is greater than the lateral breakdown (disregarding any issues associated with processing), then there is a trade-off between the blocking voltage capability of the transistor and its on-resistance. In this case, the higher the breakdown voltage, the higher the on-resistance.

While these general formulae express the highest voltage blocked by the drain of the VBT, the actual BV of any given VBT may depend on a variety of factors, such as, for example, processing, edge termination, and device dimensions.

Figure 2:
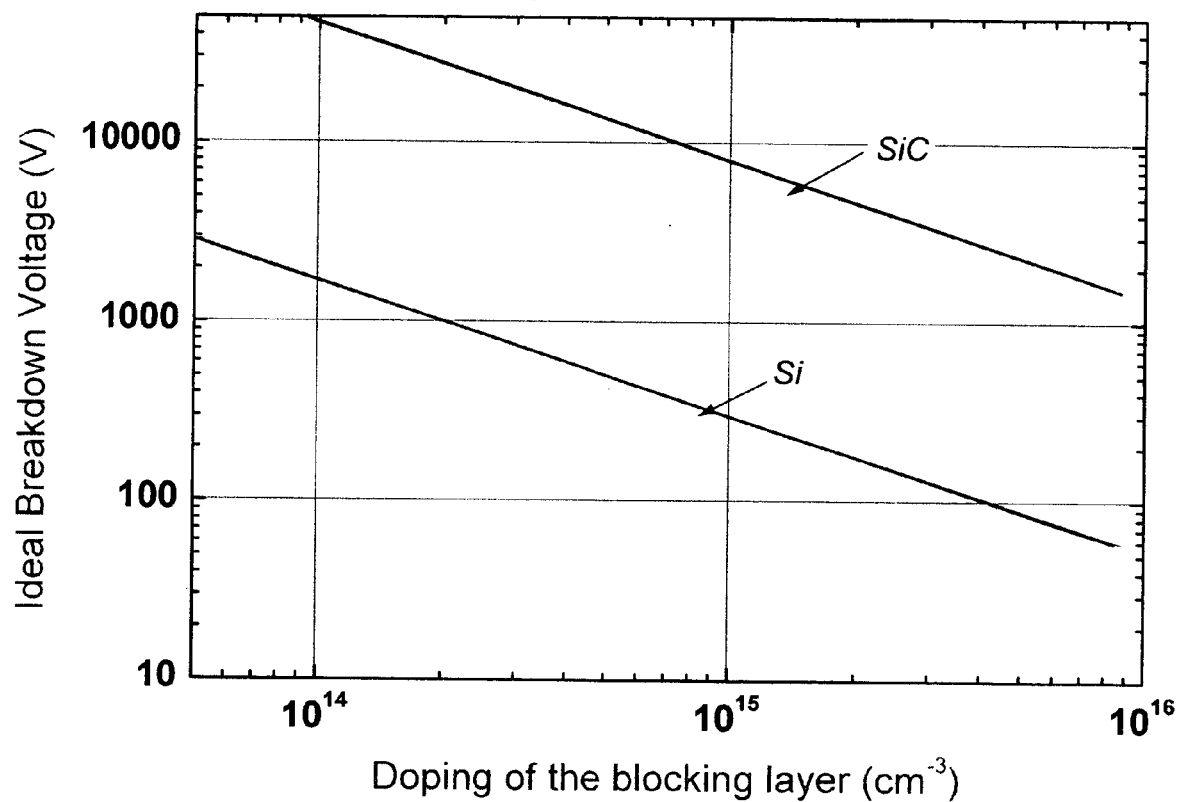
FIG. 2 shows an exemplary illustration of ideal breakdown voltage versus doping of the blocking layer for silicon and silicon carbide.

A comparison of the ideal breakdown voltage versus the doping of the blocking layer (for a VBT formed using Si and SiC) is illustrated in FIG. 2. As shown, as the doping of the blocking layer is decreased, higher ideal breakdown voltages may be attained for the vertical breakdown condition.

$V_{pinch}$ of the VBT may be defined as the source to gate reverse bias at which a portion of the channel region (e.g., between the p backside gate and the p+topside gate) is completely depleted allowing no current to flow between the source and the drain. $V_{pinch}$ may be expressed as:

$$V_{pinch} = \frac{1}{2}\frac{qN_{resurf} \times t_{resurf}^2}{\varepsilon}$$

The doping and thickness of layer 130 under the gate region 108 should be such that the vertical blocking voltage is greater than the blocking voltage rating of the VBT.

Figure 3:
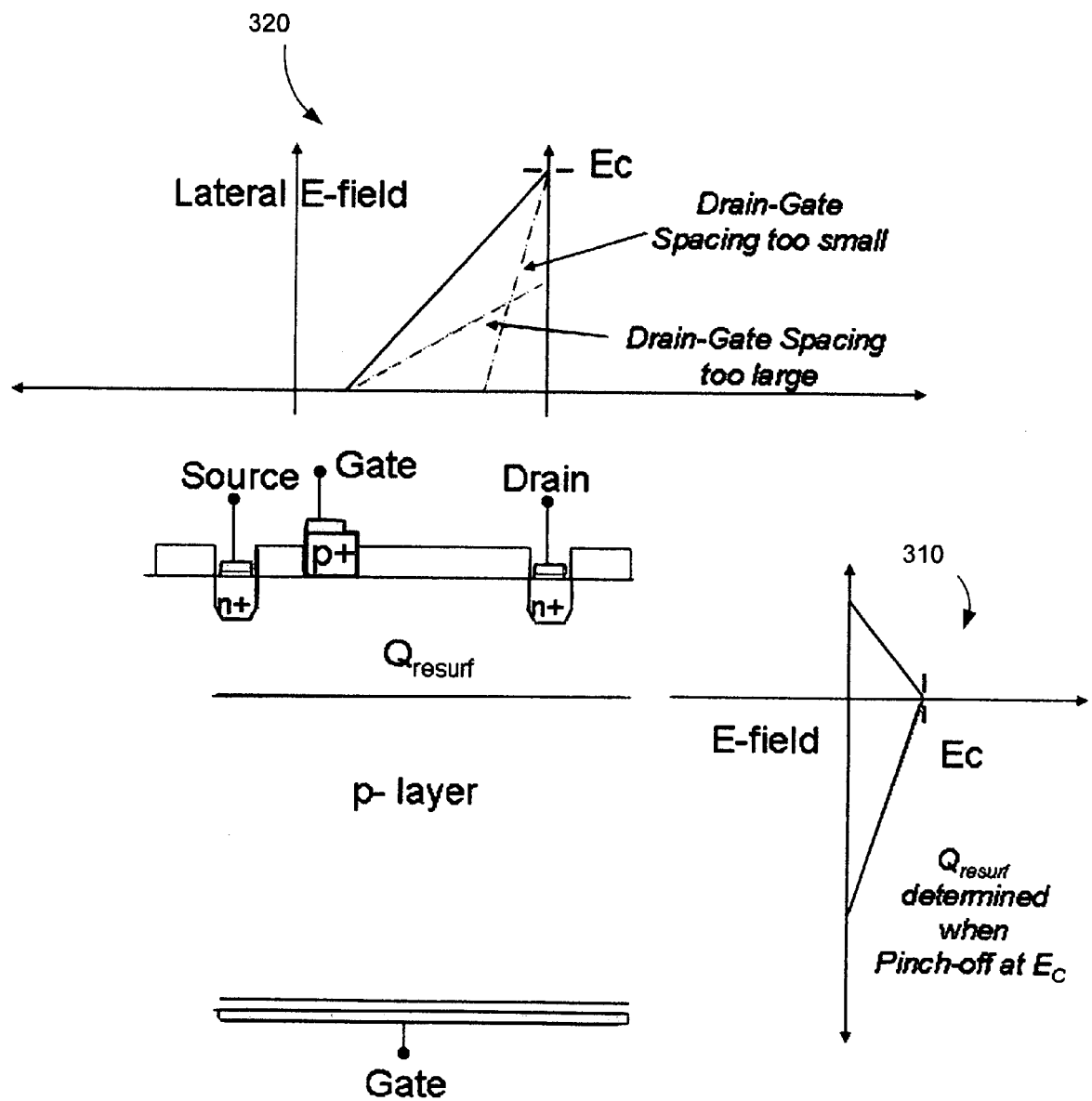
FIG. 3 shows an exemplary voltage booster transistor structure with illustrations of the vertical electric field at a resurf layer and a p layer junction and the lateral electric field plotted between a top side p gate and the drain.

FIG. 3 illustrates several electric fields in a cell 100 of the VBT shown in FIG. 1, when $V_{gate}=0$ V, $V_{source}=V_{pinch}$, and $V_{drain}=BV$. The vertical electric field 310 along the drain-gate junction and the lateral electric field 320 close to the PN junction are plotted in FIG. 3. The pinch-off condition is defined as the source to backside gate reverse biased voltage when the resurf layer under the gate region 108 (i.e., the channel) is fully depleted, thereby preventing the flow of current from the source to the drain.

An important design and performance parameter of a field effect power device is blocking gain (BG). The BG of the VBT may be defined as:

$$\text{Blocking Gain}(BG) = \frac{BV}{V_{pinch}}$$

It may be advantageous in some applications to have a high BG for a given BV rating of the device being implemented. The VBT provides a high BG, for example, of 19 or greater, which is not provided by conventional JFETs including buried channel JFETs). The high BV may be achieved by the use of low doped layers 110 and 120, which increases the maximum sustainable voltage between the drain and the gate terminals. In marked contrast, conventional buried gate JFET designs do not account for the drain to gate breakdown voltage which results in a low BV for these devices.

For example, consider a VBT with a $V_{pinch}$ of 30 V, BV of 1200 V where the backside and the topside gates are held at ground potential. For a source and drain voltage lower than 30 V, the undepleted conduction path between the source and drain will conduct current. When the drain voltage is increased, the electric field 310 between the backside gate to drain junction increases until it approaches the critical electric field of the semiconductor $E_{cr}$. When the applied drain voltage causes the backside gate to drain junction electric field to exceed $E_{cr}$, the VBT suffers a backside gate to drain breakdown (i.e., a vertical breakdown). The lateral breakdown voltage may be determined by the length of the drift region (i.e., $L_{drift}$). $L_{drift}$ may be determined so that the electric field 320 is near zero at the resurf layer under the topside gate region when the full BV is applied at the drain terminal. The electric field along the lateral direction decreases monotonically from the drain terminal towards the topside gate region 108, expressed as $$E(x) = \frac{qN_{resurf}}{\varepsilon}x,$$

where x=0 corresponds to the location of the topside gate region 108. A maximum voltage on the drain is supported with the least drift region resistance for the drift region length 195, which may be expressed as:

$$L_{Drift} = \frac{(\text{Between 2 and 1}) \times BV_{Lat}}{E_{cr}}$$

(assuming vertical breakdown does not occur before BV is achieved). For the condition that $L_{Drift}$ is sufficiently long as specified by this equation, the value of BV is as given previously for the defined lateral breakdown formula.

The conduction path below the topside gate region 108 and the PN junction may be doped with a uniformly decreasing doping profile. Such a profile can be achieved using an optimized ion implant regimen, or by using the tail portion of an ion implant used to form layer 130. Alternatively, the profile also can be provided using dopant diffusion. For example, profiles include tail of Gaussian profile, tail of any moment of a Pearson distribution, $$N_{resurf}(y) \propto \frac{1}{y}, N_{resurf}(y) \propto \frac{1}{y^2},$$

or increasing power of 1/y.

Operation of the VBT

The VBT may be operated in at least two different circuit modes: a common-source mode and a common-gate mode. In the common-source mode, the source terminal is placed at ground potential, and the backside gate terminal is varied between ground and $V_{pinch}$. However, the source and backside gate voltages may swing more than this range during some switching transients. The drain voltage may be varied from ground to BV.

In the common-gate mode, the backside gate is placed at ground potential, and the source is varied between ground and $V_{pinch}$. However, the source and backside gate voltages may swing more than this range during some switching transients. The drain voltage may be varied between ground and BV.

Both in the common-source mode and the common-gate mode, BV is greater than $V_{pinch}$. In one implementation, the VBT may be designed, such that, BV is significantly greater than $V_{pinch}$ (e.g., a range of $V_{pinch}$ of 0 V to 100 V, and BV is 600 V to 25 kV). When the source and backside gate voltage equal 0 V, a small drain bias will cause current to flow between the source and the drain terminals through layer 130. As the source to backside gate bias is increased, the reverse bias between the PN junction (e.g., between layer 120 and layer 130 or layer 110 and layer 130 (if layer 120 is not present)) also increases. As a result, the depletion from the backside gate and the topside gate constricts the current flow path until the source to gate voltage reaches a level where the conducting path is completely depleted between the topside gate and the backside gate.

When the conduction path is completely pinched off, the drain voltage can be increased until the BV of the VBT is reached. The BV is supported between the PN junction layers (e.g., between layer 110/layer 120 and layer 130). In one implementation, the electric field at the topside gate to resurf layer PN junction is the same as the electric field between the backside gate p region to resurf layer PN junction. In this implementation, both of these junctions reach the critical electric field, at which the breakdown of the VBT occurs.

Layout of the VBT

Figure 4:
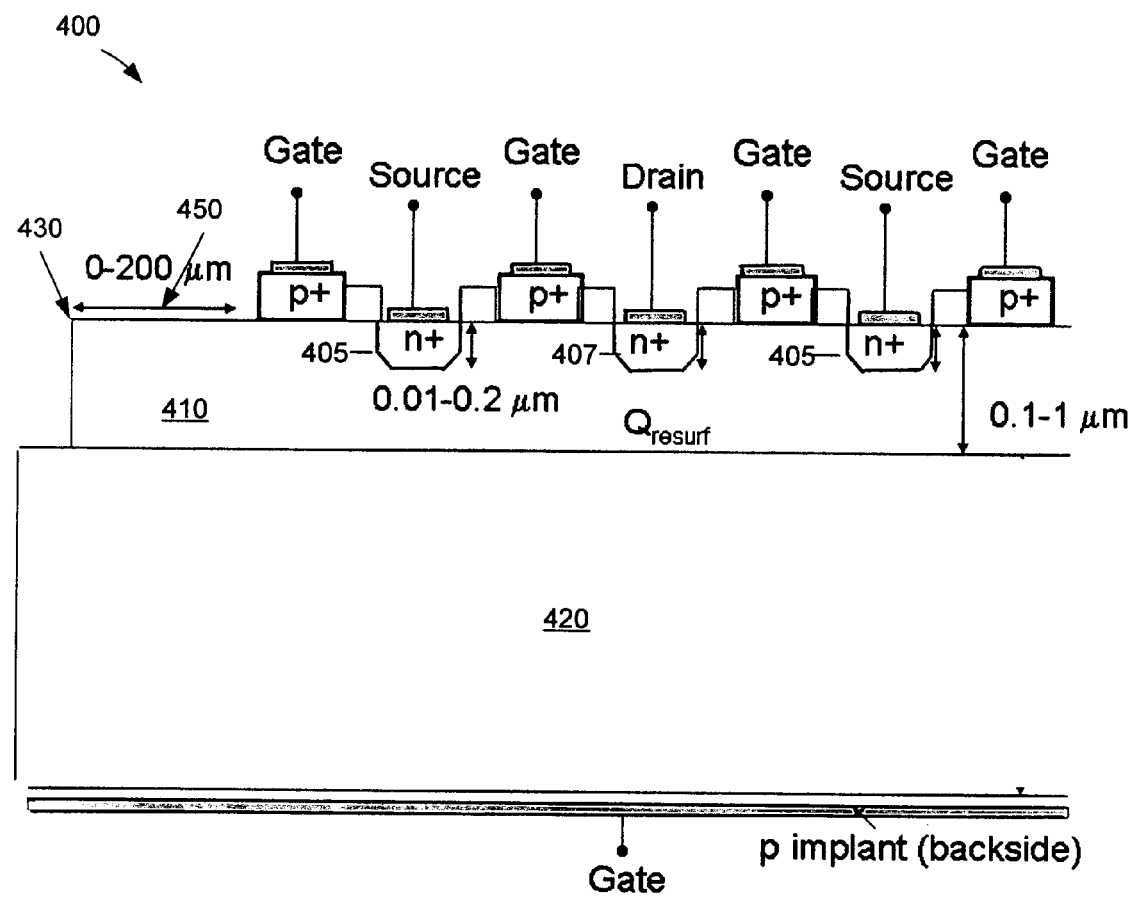
FIG. 4 shows an exemplary cell repeated and mirror imaged to form a power transistor.

The structure of a cell of the VBT is shown in FIG. 1 and described above. However, an entire power transistor chip may be formed using multiple cells 100. For example, FIG. 4 shows a schematic diagram of the cell 100 of FIG. 1 repeated and mirror imaged to form a power transistor chip 400. As shown in FIG. 4, one or more n type layers 410 are formed on one or more p type layers and/or a substrate 420. In addition, a number of source regions 405 and drain regions 407 are formed in the n type layer 410. The edge 430 of the one or more n-type layer 410 does not necessarily extend to the edge of the substrate 420. To confine the electric field, the edge 430 of top n-type layer 410 (e.g., layer 130 and/or layer 140) may be extended beyond the gate region 408 by a predetermined length ($L_{extend}$) 450. $L_{extend}$ may be determined by the BV rating of the device for which the VBT is to be used, such as, for example, between zero to 200 μm.

Figure 5:
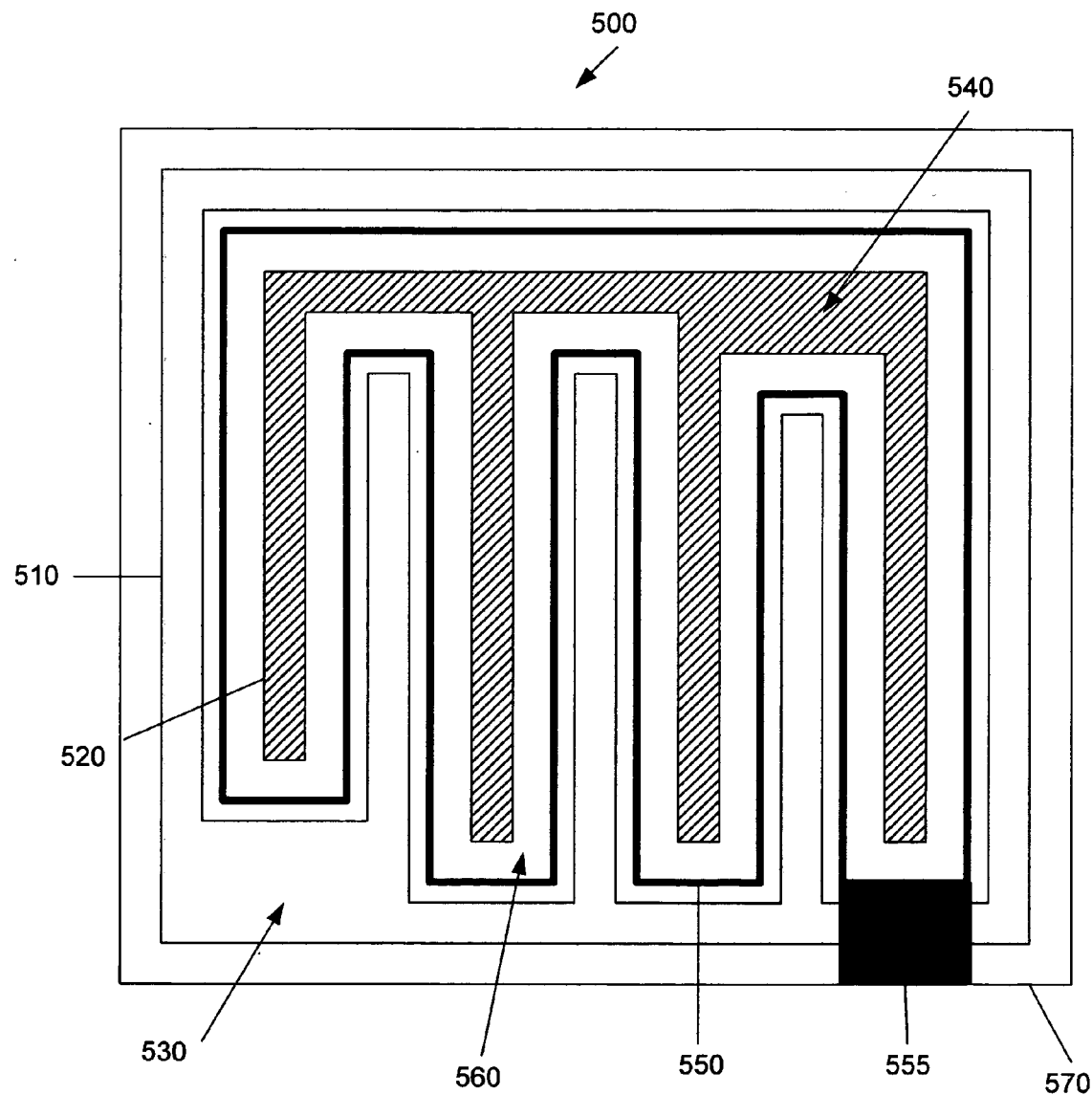
FIG. 5 shows an exemplary single chip top view layout using voltage booster transistors.

FIG. 5 shows an exemplary top view of a single chip 500 incorporating the VBT structure. As shown, a source n+ metallization area 510 and a drain n+ metallization area 520 may form interdigitated fingers, connected by a source bond pad 530 and a drain bond pad 540, respectively. A topside gate region 550 surrounds the drain metallization area 520 and is connected by a gate bond pad 555. A low doped channel region) may be formed in a passivating dielectric region 560 that surrounds the topside gate region 550. The entire chip may be formed on a substrate 570. Of course, other configurations of the source and drain regions may be implemented, for example, they may form a serpentine layout. Other configurations of the bond pads may be used including multiple source and drain bond pads with isolated fingers on the same chip.

Figure 6:
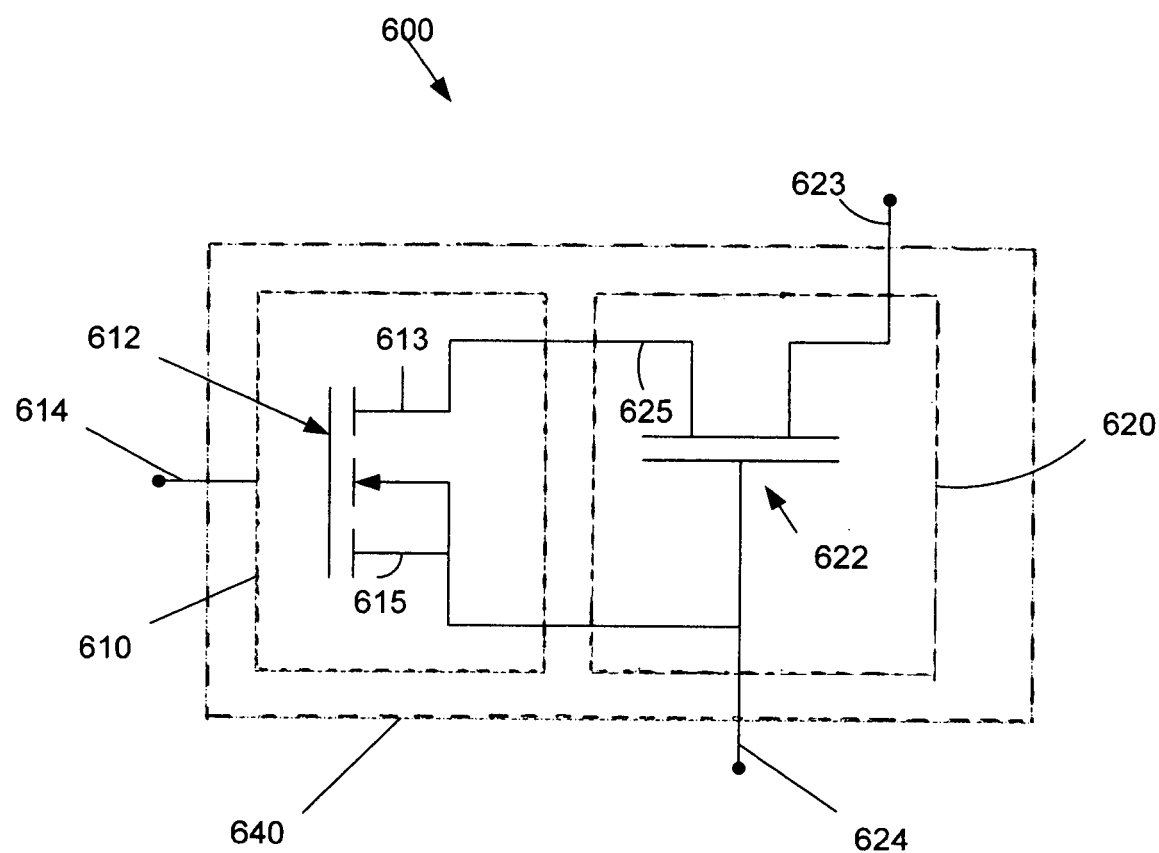
FIG. 6 shows an exemplary cascode configuration using a widebandgap voltage booster transistor with conventional low voltage components.

FIG. 6 shows an exemplary two-stage cascode configuration 600 using a VBT. The first stage 610 (e.g., a driver stage) of the cascode configuration 600 shown in FIG. 6 may be implemented using a low voltage, high current transistor 612, such as, for example, a MOSFET, an intelligent power module, a microwave HEMT, an HBT, a BJT or a MMIC with end driver. The second stage 620 is implemented using a widebandgap (WBG) high voltage VBT 622 that is operated in the common-gate mode. Source 625 of the VBT 622 is connected to the drain 613 (or collector for bipolar devices) of the first stage transistor 612. The source 615 (or emitter for bipolar devices) of the first stage transistor 612 and the gate 624 of the VBT 622 are connected together. The drain 623 of the VBT 622 may be connected to a high voltage source (e.g., 120 V to 15 kV).

The two stage composite structure 600 provides a high power transistor 640 that may be used with conventional gate drive circuits. Conventional gate drive circuits used to operate a low voltage MOSFET do not need to supply high continuous currents in order to control the operation of the composite high power transistor. Since the gate terminal of the composite cascoded MOSFET/VBTs of FIG. 6 is a low voltage MOSFET or a similar conventional transistor, the requirements on the gate drive circuits are correspondingly low continuous currents. In one implementation, the first stage transistor should have a breakdown voltage that is slightly greater than $V_{pinch}$ of the VBT 622. In addition, the first and second stage transistors may have closely matched thermal characteristics.

The VBT may be used in microwave applications. For microwave or radio frequency (RF) applications, the first stage 610 may be implemented using a HEMT, a modulation doped FET (MODFET), a HBT, or an end stage of a MMIC. These first stage devices may be normally-on or normally-off devices, depending on their suitability to their application in a circuit. The VBT may be used advantageously in microwave and RF circuits because of the reduced capacitances between the terminals.

Linearity in microwave transistors is considered another key performance parameter. The input control voltage of microwave transistors should be directly proportional to the output current or voltage to provide distortion-free amplification of input signals. The cascode configuration of a first stage microwave HEMT/HBT and a second stage WBG VBT also may be used to achieve better drain current/gate Voltage ($I_D/V_G$) linearity by appropriately changing the doping profile in resurf layer (e.g., layer 130). For example, conventional input transistors usually have an $I_D/V_G$ relationship such as $I_D \propto V_G^2$, however, a more desirable relationship is $I_D \propto V_G$. If the doping profile of a VBT along the vertical direction in the channel layer is uniformly decreasing with depth, a net $I_D/V_G$ relationship close to $I_D \propto V_G$ is provided. Examples of such doping profiles where $N_{resurf}$ is inversely proportional to the depth and/or the square of the depth of the resurf layer where the surface at the P/N junction of the low doped layers (e.g., the backgate layer 120 and/or the substrate layer 110)) corresponds to the bottom of the resurf layer. A simple way to achieve this is through the tail region of a Gaussian implant profile, or a graded implant regimen.

Variations of the VBT Cell

Figure 7:
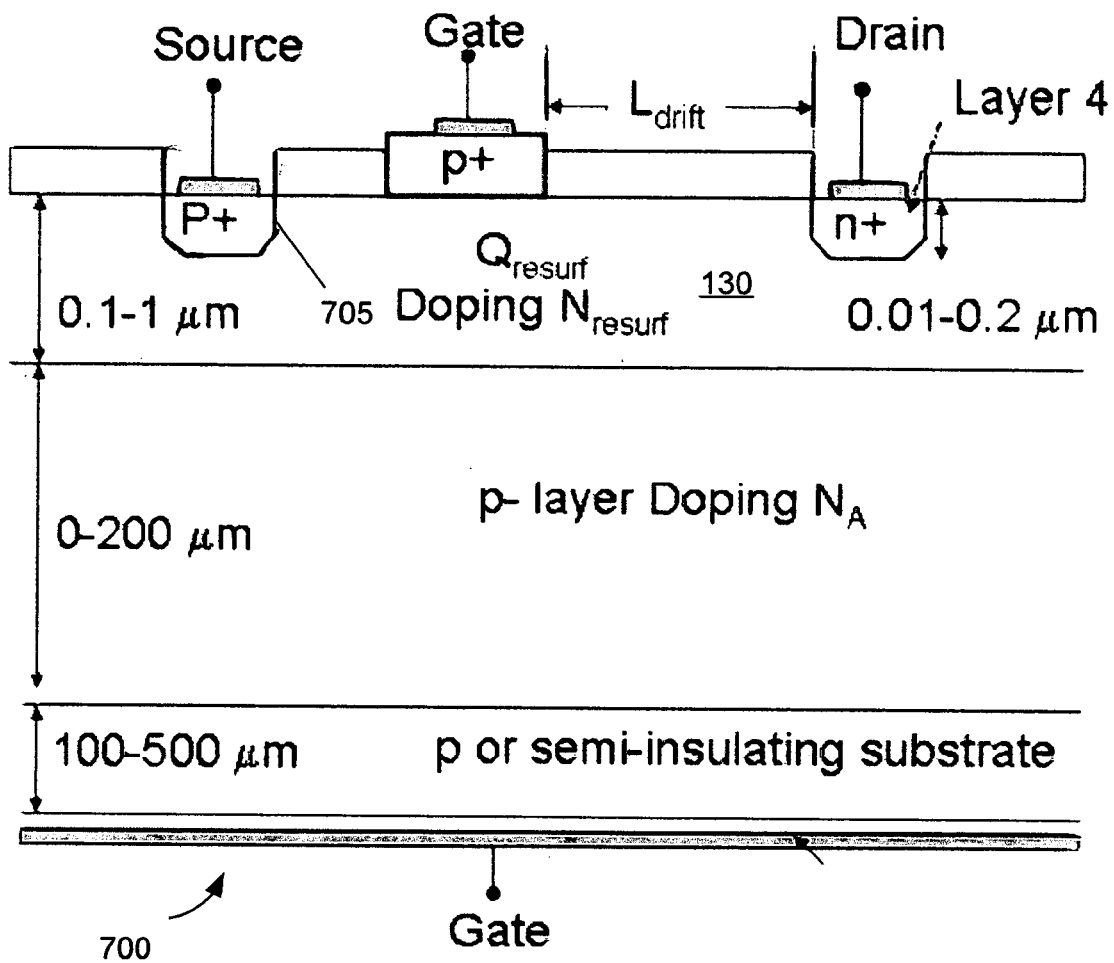
FIG. 7 shows an exemplary voltage booster transistor with p+ source region.

FIG. 7 shows and VBT 700 with a source p+ region 705 formed in layer 130. Instead of a drift-mode as outlined above, this variation allows the VBT to be operated in a bipolar mode. In this variation, a diffusion method of current conduction is provided. The source to resurf region forms a PN junction and injects minority carriers in the forward bias mode of operation, as shown in FIG. 7. A higher current density can be achieved for this structure because of the lower resistance offered during minority carrier injection as compared to the drift mode (i.e., a purely resistive) current transport.

Figure 8:
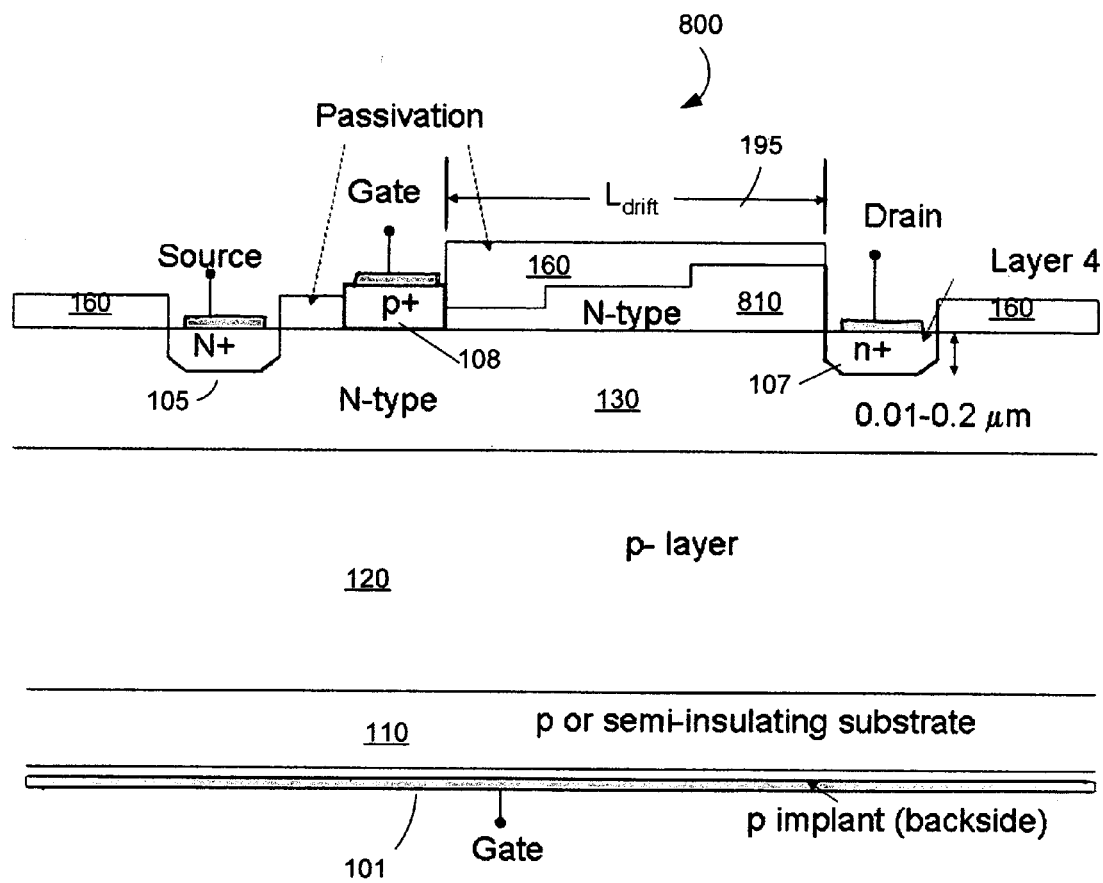
FIG. 8 shows an exemplary voltage booster transistor with stepwise approximation of the ideal doping profile with increasing n-type doping in the resurf layer from the source to the drain terminals.

FIG. 8 illustrates another implementation of a VBT that provides a linearly increasing dose profile of layer 130 using a stepwise increasing n-type dose from the topside gate region 108 to the drain region 107. As shown, an n-type extension of layer 130 provides higher dose of the n-type region approaching the drain region 107. A passivating dielectric a layer may cover the n-type extension. The n-type extension may be epitaxially grown on layer 130 or it may ion implanted in the passivating dielectric.

Widebandgap semiconductors like silicon carbide (SiC) and diamond offer excellent properties for the realization of high performance, next generation power and microwave (RF) devices. These properties include: (a) an order of magnitude higher breakdown electric field; (b) a much higher thermal conductivity; and (c) a wider bandgap than silicon. A high breakdown electric field allows the design of power devices with thinner and higher doped blocking layers. This allows design of power devices with two orders of magnitude lower on-resistance in majority carrier devices. The high thermal conductivity allows dissipated heat to be readily extracted from the device. The large bandgap results in a much higher operating temperature and higher radiation hardness. Hence, a larger power can be applied to the device for a given junction temperature.

Conventional power and microwave transistors made with these semiconductors face various challenges in terms of performance and ease of manufacture. Three major performance parameters are: on-resistance for a given area (called specific on-resistance), breakdown voltage, and switching speed. There exists a fundamental trade-off between specific on-resistance and the breakdown voltage achieved using a particular thickness of semiconductor. Counter-intuitively, lateral power devices offer one half to one quarter resistance for a given breakdown voltage as compared to vertical power devices. Yet a vast majority of transistors are designed with a vertical design because most conventional designs in Si (the dominant material for power device realization) use such a design. A vertical design is used because semi-insulating and insulating versions of Si are difficult to achieve as compared to highly conducting versions. On the other hand, many widebandgap transistors occur in semi-insulating and insulating versions more readily.

Ion implantation and dopant diffusion is a much more challenging technology for most widebandgap semiconductors as compared to Si. Since many power transistor designs in Si use ion implantation and diffusion, many power device designs in widebandgap continue to use these steps for conventional device realization. This results in low yields and high costs.

The VBT eliminates many of these challenges of widebandgap transistors. The VBT has the important advantage of a lateral BV using widebandgap materials to achieve a low specific on-resistance as compared to conventional vertical power device designs. The specific doping and thicknesses of various layers may be designed as required to provide a specific desired performance for any particular application.

Many power device designs like the MOSFET and MESFET suffer from high source to gate capacitances because of a small spacing between the source and gate terminals. Through the VBT's unique placement of backside gate terminal on the opposite end of the wafer as compared to the source and drain terminals, the VBT realizes a much lower capacitance between all the device terminals. Since terminal capacitances are the primary determining factors for the switching speed. As a result, the VBT has a distinct advantage over other transistor designs in widebandgap transistors.

A number of exemplary implementations have been described. Nevertheless, it will be understood that various modifications may be made. For example, suitable results may be achieved if the steps of described techniques are performed in a different order and/or if components in a described system, architecture, device, or circuit are combined in a different manner and/or replaced or supplemented by other components. Accordingly, other implementations are within the scope of the following claims.

What is claimed is:

1. A lateral superjunction field effect transistor (LSJFET) comprising:
   one or more layers having a first and a second surface including at least one layer formed of a widebandgap semiconductor having a first conductivity type;
   a resurf layer of the widebandgap semiconductor having a second conductivity type formed on the at least one layer of the first conductivity type at the first surface;
   a backside gate formed on the second surface of the one or more layers;
   a source region in contact with the resurf layer;
   a drain region, in contact with the resurf layer and spaced apart from the source region;
   a current conduction path in the resurf layer between the source region and the drain region; and
   a gate region in contact with the resurf layer between the source region and the drain region, having the first conductivity type, wherein the at least one layer is a backgate layer having a carrier concentration of dopant atoms of less than $10^{17}$ cm$^{-3}$.

2. The LSJFET of claim 1 wherein the source and drain regions have the second conductivity type.

3. The LSJFET of claim 2 wherein the first conductivity type is p-type and the second conductivity type is n-type.

4. The LSJFET of claim 1 having a lateral breakdown voltage between the source region and the drain region and a vertical breakdown voltage between the drain region and the backside gate, wherein the vertical breakdown voltage is greater than or equal to the lateral breakdown voltage.

5. The LSJFET of claim 1 having a blocking voltage of 600 V to 25 kV.

6. The LSJFET of claim 1 wherein the one or more layers includes a substrate layer having a carrier concentration of dopant atoms of 0 cm$^{-3}$ to $1\times10^{22}$ cm$^{-3}$.

7. The LSJFET of claim 6 wherein the substrate layer has a thickness of 100 to 500 μm.

8. The LSJFET of claim 1 wherein the resurf layer has a carrier concentration of dopant atoms of $1\times10^{15}$ cm$^{-3}$ to $1\times10^{19}$ cm$^{-3}$.

9. The LSJFET of claim 8 wherein the resurf layer has a thickness of 0.01 to 5 μm.

10. The LSJFET of claim 1 wherein backgate layer has a thickness of 0.1 to 200 μm.

11. The LSJFET of claim 1 wherein a region of the resurf layer below the gate region is doped with a doping profile substantially uniformly decreasing with depth from the gate region.

12. The LSJFET of claim 1 wherein the widebandgap semiconductor has a bandgap EG greater than 2 eV and less than 8 eV.

13. The LSJFET of claim 1 wherein the widebandgap semiconductor is silicon carbide.

14. The LSJFET of claim 13 wherein the face of the silicon carbide is one of 0001, 000–1, and 11–20.

15. The LSJFET of claim 13 wherein the widebandgap semiconductor has a bandgap EG greater than 2.1 eV and less than 4 ev.

16. The LSJFET of claim 1 wherein the widebandgap semiconductor is diamond.

17. The LSJFET of claim 16 wherein the widebandgap semiconductor has a bandgap EG of approximately 5 eV.

18. The LSJFET of claim 1 wherein the widebandgap semiconductor is aluminum nitride.

19. The LSJFET of claim 18 wherein the widebandgap semiconductor has a bandgap EG of approximately 6.1 eV.

20. The LSJFET of claim 1 wherein the widebandgap semiconductor is gallium nitride.

21. The LSJFET of claim 20 wherein the widebandgap semiconductor has a bandgap EG greater than 3 eV and less than 5 eV.

22. The LSJFET of claim 1 wherein having a blocking gain of greater than or equal to 20.

23. The LSJFET of 22 claim wherein the blocking gain is expressed as $BV/V_{pinch}$, where BV is the voltage blocked at the drain and the $V_{pinch}$ is the pinch-off voltage causing pinch-off of the conduction path.

24. The LSJFET of claim 1 wherein the resurf layer has a substantially stepwise increasing dose profile of the second conductivity type from the gate region to the drain region.

25. The LSJFET of claim 1 further comprising an expitaxially grown extension of resurf layer of the second conductivity type between the drain region and the gate region.

26. The LSJFET of claim 25 wherein the extension provides a substantially increasing dose profile of the second conductivity type from the gate region to the drain region.

27. The LSJFET of claim 1 further comprising an ion implanted extension of resurf layer of the second conductivity type between the drain region and the gate region.

28. The LSJFET of claim 27 wherein the extension provides a substantially increasing dose profile of the second conductivity type from the gate region to the drain region.

29. The LSJFET of claim 1 wherein having a specific on resistance of less than 300 mΩ-cm².

30. The LSJFET of claim 1 wherein the source region is the first conductivity type and the drain region is the second conductivity type.

31. The LSJFET of claim 30 wherein the first conductivity type is p-type and the second conductivity type is n-type.

32. A lateral superjunction field effect transistor (LSJFET) comprising:
one or more layers having a first and a second surface including at least one layer of a widebandgap semiconductor having a first conductivity type;
a resurf layer of the widebandgap semiconductor having a second conductivity type formed on the at least one layer of the first conductivity type at the first surface, the resurf layer having a doping profile substantially uniformly decreasing with depth;
a backside gate formed on the second surface of the one or more layers;
a source region in contact with the resurf layer;
a drain region in contact with the resurf layer spaced apart from the source region;
a lateral current conduction path in the resurf layer between the source region and the drain region; and
a gate region in contact with the resurf layer between the source region and the drain region, wherein the doping $N_{resurf}$ of the resurf layer and the thickness of the resurf layer $t_{resurf}$ is expressed as range of plus or minus 50% of:

$$\frac{1}{L_{Drift}} \int_0^{t_{resurf}} \int_0^{L_{Drift}} N_{resurf}(x, y) \partial x \partial y = \frac{\varepsilon \times E_{cr}}{q}$$

where $E_{cr}$ is the critical breakdown electric field of the semiconductor, ε is the dielectric constant of the semiconductor. 'q' is the electronic charge, and $L_{Drift}$ is the distance between the drain region and the gate region.

33. The LSJFET of claim 32 wherein the doping profile of the resurf layer is inversely proportional to the depth of the resurf layer.

34. The LSJFET of claim 32 wherein the doping profile of the resurf layer is inversely proportional to the square of the depth of the resurf layer.

35. A lateral superjunction field effect transistor (LSJFET) comprising:
one or more layers having a first and a second surface including at least one layer of a widebandgap semiconductor having a first conductivity type;
a resurf layer of the widebandgap semiconductor having a second conductivity type formed on the at least one layer of the first conductivity type at the first surface, the resurf layer having a doping profile substantially uniformly decreasing with depth;
a backside gate formed on the second surface of the one or more layers;
a source region in contact with the resurf layer;
a drain region in contact with the resurf layer spaced apart from the source region;
a lateral current conduction path in the resurf layer between the source region and the drain region; and
a gate region in contact with the resurf layer between the source region and the drain region, wherein the gate region is located at a distance $L_{Drift}$ from the drain region where $L_{Drift}$ is expressed as:

$$L_{Drift} = \frac{(\text{Between 2 and 1}) \times BV_{Lat}}{E_{cr}}$$

where $BV_{lat}$ is the lateral breakdown voltage between source and drain and $E_{cr}$ is the critical electric field of the semiconductor.

36. A lateral superjunction field effect transistor (LSJFET) comprising:
one or more layers having a first and a second surface including at least one layer formed of a widebandgap semiconductor having a first conductivity type;
a resurf layer of the widebandgap semiconductor having a second conductivity type formed on the at least one layer of the first conductivity type at the first surface;
a backside gate formed on the second surface of the one or more layers;
a source region in contact with the resurf layer;
a drain region, in contact with the resurf layer and spaced apart from the source region;
a current conduction path in the resurf layer between the source region and the drain region; and a gate region in contact with the resurf layer between the source region and the drain region, having the first conductivity type, wherein the doping $N_{resurf}$ of the resurf layer and thickness of the resurf layer $t_{resurf}$ is expressed as a range of plus or minus 50% of;

$$\frac{1}{L_{Drift}} \int_0^{t_{resurf}} \int_0^{L_{Drift}} N_{resurf}(x, y) \partial x \partial y = \frac{\varepsilon \times E_{cr}}{q}$$

where $E_{cr}$ is the critical breakdown electric field of the semiconductor, $\varepsilon$ is the dielectric constant of the semiconductor, 'q' is the electronic charge, and $L_{Drift}$ is the distance between the drain region and the gate region.

37. A lateral superjunction field effect transistor (LSJFET) comprising:
   one or more layers having a first and a second surface including at least one layer formed of a widebandgap semiconductor having a first conductivity type;
   a resurf layer of the widebandgap semiconductor having a second conductivity type formed on the at least one layer of the first conductivity type at the first surface;
   a backside gate formed on the second surface of the one or more layers;
   a source region in contact with the resurf layer;
   a drain region, in contact with the resurf layer and spaced apart from the source region;
   a current conduction path in the resurf layer between the source region and the drain region; and
   a gate region in contact with the resurf layer between the source region and the drain region, having the first conductivity type, wherein the gate region is located at a distance $L_{Drift}$ from the drain region where $L_{Drift}$ is expressed as;

$$L_{Drift} = \frac{(\text{Between 2 and 1}) \times BV_{Lat}}{E_{cr}}$$

where $BV_{lat}$ is the lateral breakdown voltage between source and drain and $E_{cr}$ is the critical electric field of the semiconductor.

38. A lateral superjunction field effect transistor (LSJFET) comprising;
   one or more layers having a first and a second surface including at least one layer formed of a widebandgap semiconductor having a first conductivity type;
   a resurf layer of the widebandgap semiconductor having a second conductivity type formed on the at least one layer of the first conductivity type at the first surface;
   a backside gate formed on the second surface of the one or more layers;
   a source region in contact with the resurf layer;
   a drain region, in contact with the resurf layer and spaced apart from the source region;
   a current conduction path in the resurf layer between the source region and the drain region; and
   a gate region in contact with the resurf layer between the source region and the drain region, having the first conductivity type, wherein the junction between the resurf layer of the second conductivity type and the at least one layer of the first conductivity type provides a voltage blocking PN junction below the current conduction path in the resurf layer and the at least one layer provides a substantially continuous, linear gradation of voltage in the resurf layer between the gate region and the drain region.

39. A lateral superjunction field effect transistor (LSJFET) comprising:
   one or more layers having a first and a second surface including at least one layer of a widebandgap semiconductor having a first conductivity type;
   a resurf layer of the widebandgap semiconductor having a second conductivity type formed on the at least one layer of the first conductivity type at the first surface, the resurf layer having a doping profile substantially uniformly decreasing with depth;
   a backside gate formed on the second surface of the one or more layers;
   a source region in contact with the resurf layer;
   a drain region in contact with the resurf layer spaced apart from the source region;
   a lateral current conduction path in the resurf layer between the source region and the drain region; and
   a gate region in contact with the resurf layer between the source region and the drain region, wherein the junction between the resurf layer of the second conductivity type and the at least one layer of the first conductivity type provides a voltage blocking PN junction below the current conduction path in the resurf layer and the at least one layer provides a substantially continuous, linear gradation of voltage in the resurf layer between the gate region and the drain region.

* * * * *